United States Patent
Ebata et al.

(10) Patent No.: US 9,153,438 B2
(45) Date of Patent: Oct. 6, 2015

(54) SINTERED OXIDE BODY, TARGET COMPRISING THE SAME, AND OXIDE SEMICONDUCTOR THIN FILM

(75) Inventors: Kazuaki Ebata, Sodegaura (JP); Shigekazu Tomai, Sodegaura (JP); Koki Yano, Sodegaura (JP); Kazuyoshi Inoue, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 170 days.

(21) Appl. No.: 13/699,851

(22) PCT Filed: May 24, 2011

(86) PCT No.: PCT/JP2011/002873
§ 371 (c)(1),
(2), (4) Date: Dec. 17, 2012

(87) PCT Pub. No.: WO2011/148614
PCT Pub. Date: Dec. 1, 2011

(65) Prior Publication Data
US 2013/0082218 A1 Apr. 4, 2013

(30) Foreign Application Priority Data
May 27, 2010 (JP) ................. 2010-121471

(51) Int. Cl.
*C04B 35/01* (2006.01)
*H01L 21/02* (2006.01)
(Continued)

(52) U.S. Cl.
CPC .......... *H01L 21/02658* (2013.01); *C04B 35/01* (2013.01); *C04B 35/62218* (2013.01); *C04B 35/62675* (2013.01); *C23C 14/086* (2013.01); *C23C 14/3414* (2013.01); *H01L 21/02381* (2013.01); *H01L 21/02422* (2013.01); *H01L 21/02488* (2013.01); *H01L 21/02565* (2013.01); *H01L 21/02631* (2013.01);
(Continued)

(58) Field of Classification Search
CPC ........ C04B 35/00; C23C 14/34; H01L 21/20; H01L 21/203; H01L 21/363; H01L 29/786; H01B 1/08
USPC ................. 252/518.1; 977/890, 755; 264/648; 204/298.13, 192.25
See application file for complete search history.

(56) References Cited

U.S. PATENT DOCUMENTS

| | | | |
|---|---|---|---|
| 2010/0065835 A1 | 3/2010 | Inoue et al. | |
| 2010/0127256 A1* | 5/2010 | Inoue et al. | ...... 257/43 |

(Continued)

FOREIGN PATENT DOCUMENTS

| | | |
|---|---|---|
| JP | 09-152940 | 6/1997 |
| JP | 2000-169220 | 6/2000 |

(Continued)

OTHER PUBLICATIONS

Nishimura et al. "Micorstructures of ITO films deposited by d.c. magnetron sputtering with H2O introduction." Science Direct. 6 total pages. (Used for 103 rejection for claim 6).*

(Continued)

*Primary Examiner* — Mark Kopec
*Assistant Examiner* — Danny N Kang
(74) *Attorney, Agent, or Firm* — Foley & Lardner LLP (57) ABSTRACT

An oxide sintered body including an oxide of indium and aluminum and having an atomic ratio Al/(Al+In) of 0.01 to 0.08.

10 Claims, 2 Drawing Sheets

(51) Int. Cl.
    C04B 35/622    (2006.01)
    C04B 35/626    (2006.01)
    C23C 14/08     (2006.01)
    C23C 14/34     (2006.01)
    H01L 21/00     (2006.01)
    H01B 1/08      (2006.01)
    H01L 29/786    (2006.01)
    B82Y 30/00     (2011.01)

(52) U.S. Cl.
    CPC ........ B82Y 30/00 (2013.01); C04B 2235/3217 (2013.01); C04B 2235/3225 (2013.01); C04B 2235/3286 (2013.01); C04B 2235/3409 (2013.01); C04B 2235/5436 (2013.01); C04B 2235/5445 (2013.01); C04B 2235/6562 (2013.01); C04B 2235/6565 (2013.01); C04B 2235/6567 (2013.01); C04B 2235/6585 (2013.01); C04B 2235/76 (2013.01); C04B 2235/77 (2013.01); C04B 2235/963 (2013.01); H01L 29/7869 (2013.01); Y10S 977/755 (2013.01); Y10S 977/89 (2013.01)

(56) References Cited

U.S. PATENT DOCUMENTS

2010/0170696 A1    7/2010    Yano et al.
2011/0315936 A1    12/2011   Inoue et al.
2012/0273777 A1    11/2012   Inoue et al.

FOREIGN PATENT DOCUMENTS

| JP | 2002-053952 | 2/2002 |
| JP | 2007-84842 | 4/2007 |
| WO | WO-2008/114588 A1 | 9/2008 |
| WO | WO 2008139860 A1 * | 11/2008 |
| WO | WO 2009128424 A1 * | 10/2009 |
| WO | WO 2010/032431 A1 | 3/2010 |
| WO | WO 2010032422 A1 * | 3/2010 |
| WO | WO 2010/035715 A1 | 4/2010 |
| WO | WO 2010/070944 A1 | 6/2010 |

OTHER PUBLICATIONS

Translation Written Opinion of the International Searching Authority PCT/JP2011/002873 dated Aug. 16, 2011.

International Search Report PCT/JP2011/002873 dated Aug. 16, 2011.

E. Nishimura et al., "Microstructures of ITO films deposited by d.c. magnetron sputtering with $H_2O$ introduction", Thin Solid Films 445 (2003) 235-240.

Office Action in JP Appln No. 2010-121471 dated Apr. 8, 2014.

* cited by examiner

SINTERED OXIDE BODY, TARGET COMPRISING THE SAME, AND OXIDE SEMICONDUCTOR THIN FILM

TECHNICAL FIELD

The invention relates to an oxide sintered body, a target comprising the same and an oxide semiconductor thin film.

BACKGROUND ART

Field effect transistors, such as a thin film transistor (TFT), are widely used as the unit electronic device of a semiconductor memory integrated circuit, a high frequency signal amplification device, a device for a liquid crystal drive, or the like, and they are electronic devices which are currently most widely put into practical use. Of these, with significant improvement in displays in recent years, in various displays such as a liquid crystal display (LCD), an electroluminescence display (EL) and a field emission display (FED), a TFT is frequently used as a switching device which drives a display by applying a driving voltage to a display device.

As a material of a semiconductor layer (channel layer) which is a main component of a field effect transistor, a silicon semiconductor compound is used most widely. Generally, a silicon single crystal is used for the high frequency amplification device and the device for integrated circuits which need high-speed operation. On the other hand, an amorphous silicon semiconductor (amorphous silicon) is used for a device for driving a liquid crystal in order to satisfy the demand for realizing a large-sized display.

A thin film of amorphous silicon can be formed at relatively low temperatures. However, the switching speed thereof is slow as compared with that of a crystalline thin film. Therefore, when it is used as a switching device which drives a display, it may be unable to follow the display of a high-speed animation. Specifically, amorphous silicon having a mobility of 0.5 to 1 cm²/Vs could be used in a liquid crystal television of which the resolution is VGA. However, if the resolution is equal to or more than SXGA, UXGA and QXGA, a mobility of 2 cm²/Vs or more is required. Moreover, if the driving frequency is increased in order to improve the image quality, a further higher mobility is required.

On the other hand, a crystalline silicon thin film had problems that, although it has a high mobility, it required great energy and a large number of steps in the production and formation of large-area display was difficult. For example, when crystallizing a silicon-based thin film, laser annealing which is conducted at a high temperature of 800° C. or higher and requires expensive equipment is required. Moreover, since the device configuration of a TFT was usually limited to the top-gate structure, reduction in cost, such as reduction of the number of masks, was difficult in the case of a crystalline silicon thin film.

Generally, fabrication of an oxide semiconductor thin film is conducted by sputtering using a target (sputtering target) which consists of an oxide sintered body. For example, an oxide semiconductor thin film obtained by doping indium oxide with aluminum has been disclosed (Patent Document 1). In the examples of Patent Document 1, an oxide semiconductor device is fabricated by using a target in which the atomic ratio of indium and aluminum Al/(Al+In) is 0.005. However, evaluation on target performance and studies on nodules which are generated at the time of sputtering were not sufficient.

RELATED ART DOCUMENTS

Patent Document

Patent Document 1: WO2010/032431

SUMMARY OF THE INVENTION

An object of the invention is to provide an oxide sintered body which can suppress abnormal discharge which occurs when an oxide semiconductor thin film is formed by the sputtering method and can form an oxide semiconductor thin film stably with a high reproducibility.

The inventors formed an oxide semiconductor thin film by the DC sputtering method by using a sputtering target in which the atomic ratio Al/(In+Al) is 0.01 to 0.08 in an oxide sintered body formed of an aluminum element, an indium element and an oxygen element. The inventors have found that the crystal structure of the target and occurrence of abnormal discharge at the time of film formation have the following relationship. That is, the inventors have found that, while if the crystal of indium oxide of the target is formed substantially of the bixbyite structure, abnormal discharge does not occur if direct current is passed, if the crystal contains other structures such as $Al_2O_3$ in addition to the bixbyite structure, abnormal discharge frequently occurs. Further, the inventors have found that, even in the case that the crystal of the oxide sintered body is formed of the bixbyite structure, if the atomic ratio Al/(In+Al) is less than 0.01, abnormal discharge tends to occur and nodules are formed. The invention has been made on this finding.

According to the invention, the following oxide sintered body and the like can be provided.

1. An oxide sintered body comprising an oxide of indium and aluminum and having an atomic ratio Al/(Al+In) of 0.01 to 0.08.
2. A method for producing the oxide sintered body according to 1, comprising the steps of:
   mixing indium oxide powder having an average particle size of less than 1.2 μm and aluminum oxide powder having an average particle size of less than 1.2 μm such that the atomic ratio Al/(A+In) becomes 0.01 to 0.08 to prepare mixture powder;
   shaping the mixture powder to produce a shaped body; and
   firing the shaped body at 1100° C. to 1550° C. for 8 hours or more.
3. The method for producing the oxide sintered body according to 2, wherein the firing is conducted in the atmosphere of an oxidizing gas.
4. A target obtained by processing the oxide sintered body according to 1.
5. An oxide semiconductor thin film which is obtained by sputtering the target according to 4 to form a thin film, followed by annealing the thin film,
   wherein the thin film has an atomic ratio Al/(Al+In) of 0.01 to 0.08 and has a bixbyite structure of indium oxide.
6. The oxide semiconductor thin film according to 5, wherein the sputtering is conducted at a water partial pressure of $5×10^{-4}$ to $7×10^{-2}$ Pa.
7. A thin film transistor having the oxide semiconductor thin film according to 5 or 6 as the channel layer.
8. A display comprising the thin film transistor according to 7.

According to the invention, it is possible to provide an oxide sintered body which can suppress abnormal discharge which occurs when an oxide semiconductor thin film is formed by the sputtering method and can form an oxide semiconductor thin film stably with a high reproducibility.

MODE FOR CARRYING OUT THE INVENTION

The oxide sintered body of the invention comprises an oxide of indium and an oxide of aluminum and has an atomic ratio Al/(Al+In) of 0.01 to 0.08.

If the atomic ratio Al/(Al+In) is in the above-mentioned range, aluminum is in a solid-solution state in indium oxide of the bixbyite structure, and as a result, the oxide sintered body has a low resistance.

The oxide sintered body of the invention has a low resistance since aluminum atoms are in the solid-solution state in indium oxide of the bixbyite structure, and hence occurrence of abnormal discharge can be suppressed.

Further, since the oxide sintered body of the invention comprises indium oxide having a bixbyite structure in which aluminum atoms are in the state of solid-solution, occurrence of cracks and generation of nodules in the target formed of the oxide sintered body of the invention can be reduced. Therefore, the oxide sintered body of the invention is capable of forming a high-quality oxide semiconductor thin film efficiently at a low cost and in an energy-saving manner.

The above-mentioned bixbyite structure can be confirmed by the XRD measurement.

The fact that the oxide sintered body of the invention comprises indium oxide having a bixbyite structure can be confirmed by the X-ray diffraction measurement (XRD measurement).

If X-rays are incident on a crystal in which atoms are regularly arranged, a strong X-ray is observed in a specific direction, and a diffraction phenomenon occurs. This can be elucidated by the fact that, when the optical path difference of X-rays which are scattered at each position is an integral multiple of the wavelength of X-rays, the phases of the waves are coincident, whereby the amplitude of the waves increases.

Since substances form a crystal which has regularity peculiar to each substance, the type of a compound can be examined by the X-ray diffraction. In addition, the size of a crystal (the order of a crystal), the distribution state of the direction of crystals present in a material (crystalline orientation) and residual stress imposed on crystals can also be evaluated.

The oxide sintered body of the invention substantially comprises indium oxide having a bixbyite structure, and aluminum atoms are in the solid-solution state in the indium oxide and has an atomic ratio Al/(Al+In) is 0.01 to 0.08, preferably.

The "substantially" means that the advantageous effects of the invention are derived from the above-mentioned bixbyite structure, or means that 90 vol % or more, preferably 95 vol % or more and further preferably 98 vol % or more of the crystal structure of the oxide sintered body is an indium oxide crystal having a bixbyite structure.

Further, 90 vol % or more, preferably 95 vol % or more and further preferably 98 vol % or more of the oxide sintered body of the invention is formed of a crystal structure. It is preferred that 90 vol % or more of the oxide sintered body of the invention be formed of a crystal structure and 90 vol % or more of the crystal structure be indium oxide having a bixbyite structure.

The volume fraction can be calculated by the peak analysis of the X-ray diffraction.

By allowing the atomic ratio Al/(Al+In) to be 0.08 or less, it is possible to disperse Al uniformly in an indium oxide crystal. On the other hand, if the atomic ratio Al/(Al+In) exceeds 0.08, Al is no longer dispersed uniformly in the bixbyite structure of indium oxide, whereby $Al_2O_3$ may be deposited. If the oxide sintered body of the invention contains other crystal structures such as $Al_2O_3$, when sputtering the target formed of the oxide crystal body, abnormal discharge may tend to occur easily.

As for the reason of the above-mentioned abnormal discharge, it can be assumed that, due to the un-uniformity of the target and the local presence of parts which differ in specific resistance, impedance of the discharge system that contains a target is varied during sputtering. The parts where the specific resistance locally differs are crystals such as $Al_2O_3$, and it is effective to suppress occurrence of abnormal discharge to decrease the size and number density of these crystals.

If the atomic ratio Al/(Al+In) is less than 0.01, the resistance of the oxide sintered body may increase. If the target resistance is increased, abnormal discharge may occur.

From the above-mentioned respects, the atomic ratio of aluminum metal and indium metal Al(Al+In) is preferably 0.01 to 0.08, more preferably 0.01 to 0.05, further preferably 0.01 to 0.03.

The atomic ratio of the each element contained in the oxide sintered body of the invention can be obtained by analyzing the elements contained by the Inductively Coupled Plasma Atomic Emission Spectroscopy (ICP-AES).

Specifically, in an analysis using ICP-AES, a sample solution is atomized by means of a nebulizer, and then introduced into argon plasma (about 6000 to 8000° C.). The elements in the sample are excited by absorbing thermal energy, whereby orbit electrons are transferred from the ground state to an orbit with a higher energy level. These orbit electrons are transferred to an orbit with a lower energy level within about $10^{-7}$ to $10^{-8}$ seconds. At this time, difference in energy is radiated as light to cause emission. Since this light has a wavelength (spectral line) peculiar to the element, the presence of the element can be confirmed by the presence of the spectral line (qualitative analysis). Further, since the amplitude of each of the spectral line (emission intensity) increases in proportion to the number of elements contained in a sample, the concentration of a sample solution can be obtained by comparing a sample solution with a standard solution with a known concentration (quantitative analysis).

After identifying the element contained by a qualitative analysis, the content thereof is obtained by a quantitative analysis. From the results, the atomic ratio of each element is obtained.

The density of the oxide sintered body of the invention is preferably 6.0 g/cm$^3$ or more, more preferably 6.3 g/cm$^3$ or more, with 6.4 g/cm$^3$ or more being further preferable.

If the density is less than 6.0 g/cm$^3$, the surface of the sputtering target formed of the oxide sintered body may be blackened to induce abnormal discharge, leading to lowering of the sputtering speed. The density is particularly preferably 6.3 g/cm$^3$ or more and 7.1 g/cm$^3$ or less.

It is desired that the maximum particle size of the indium oxide crystal in which aluminum atoms are in the solid-solution state in the oxide sintered body be 5 μm or less. If the indium oxide crystal is grown to have a particle size exceeding 5 μm, nodules may be generated.

When the target surface is ground by sputtering, the grinding speed differs depending on the direction of the crystal surface, whereby unevenness is generated on the target surface. It is assumed that, the size of this unevenness varies depending on the particle size of the crystal present in the sintered body, and in the target formed of a sintered body having a large crystal size, a greater scale of unevenness occurs, and nodules are generated from this convex part.

The maximum particle size of the above-mentioned oxide indium crystal is obtained as follows. If the sputtering target formed of the oxide sintered body of the invention has a circular shape, at five locations in total, i.e. the central point (one) and the points which are on the two central lines crossing orthogonally at this central point and are middle between the central point and the peripheral part (four), or if the sputtering target formed of the oxide sintered body of the invention has a square shape, at five locations in total, i.e. the central point (one) and middle points (four) between the central point and the corner of the diagonal line of the square, the maximum diameter is measured for the biggest particle observed within a 100-μm square. The maximum particle size is the average value of the particle size of the biggest particle present in each of the frames defined by the five locations. As for the particle size, the longer diameter of the crystal particle is measured.

The crystal particles can be observed by the scanning electron microscopy (SEM).

In the oxide sintered body of the invention, aluminum atoms are dispersed in the solid-solution state in indium oxide. It is preferred that the diameter of the aggregate of the dispersed aluminum atoms be less than 1 μm. By allowing aluminum atoms to be finely dispersed, stable sputtering discharge can be conducted.

The diameter of the aggregate of the aluminum atoms can be measured by means of an EPMA (electron probe microanalyzer).

The film-forming speed at the time of DC sputtering depends on the specific resistance of the oxide sintered body of the sputtering target. Therefore, in respect of productivity, a lower specific resistance of the oxide sintered body is preferable. The specific resistance of the oxide sintered body of the invention is preferably 0.1 Ωcm or less, more preferably 0.01 Ωcm or less. By allowing the specific resistance to be 0.01 Ωcm or less, a further film-forming speed can be realized. On the other hand, if the specific resistance of the oxide sintered body exceeds 0.1 Ωcm, it may be difficult to conduct stable film formation by DC sputtering.

The specific resistance of the oxide sintered body can be reduced by a reduction treatment which is conducted in the production process of the sintered body mentioned later in which the sintered body is heated in a non-oxidizing atmosphere such as nitrogen.

However, even though the specific resistance of the oxide sintered body is 0.1 Ωcm or less, stable DC sputtering cannot necessarily be conducted. Even if the specific resistance of the entire oxide sintered body is 0.1 Ωcm or less, if a high-resistant material phase (for example, the above-mentioned $Al_2O_3$ phase or the like) having a specific resistance exceeding 0.1 Ωcm is locally contained in the oxide sintered body, this part is electrically charged due to the irradiation of sputtering gas ion to cause abnormal discharge. As a result, DC sputtering cannot be conducted stably.

Therefore, it is important that the specific resistance of the entire oxide sintered body is 0.1 Ωcm or less, without locally containing the high-resistant phase.

The oxide sintered body of the invention comprises an oxide formed of aluminum elements, indium elements and oxygen elements, and preferably composed substantially of indium oxide having a bixbyite structure. Within a range which does not impair the advantageous effects of the invention, impurities which are inevitably mixed in may be contained.

The method of producing an oxide sintered body of the invention comprises the steps of: mixing indium oxide powder having an average particle size of less than 1.2 μm and aluminum oxide powder having an average particle size of less than 1.2 μm such that the atomic ratio Al/(Al+In) becomes 0.01 to 0.08 to prepare mixture powder; shaping the mixture powder to produce a shaped body; and firing the shaped body at 1100° C. to 1550° C. for 8 hours or more.

The oxide sintered body of the invention is not restricted by the production method thereof, and can be produced from the combination of metal aluminum and indium oxide. It is preferred that indium oxide and aluminum oxide be used as raw material powder.

If indium oxide and metal aluminum are used as the raw material powder, metal particles of aluminum are present in the resulting oxide sintered body. The metal particles on the target surface are molten during the film formation, and hence not discharged from the target. As a result, the composition of the resulting film and the composition of the oxide sintered body may differ greatly.

The indium oxide powder and the aluminum oxide powder as the raw material powder both have an average particle size of less than 1.2 μm, preferably 1.0 μm or less.

When the average particle size of the indium oxide powder or the aluminum oxide powder is 1.2 μm or more, aluminum atoms may not be dispersed uniformly into indium oxide ($In_2O_3$) crystals.

The average particle size of the above-mentioned raw material powder can be measured by a laser diffraction particle size analyzer.

$In_2O_3$ powder and $Al_2O_3$ powder are mixed such that the atomic ratio Al/(Al+In) becomes 0.01 to 0.08.

By allowing the atomic ratio Al/(Al+In) to be 0.08 or less, it is possible to obtain an oxide sintered body which is formed substantially of indium oxide having a bixbyite structure.

As for the method for mixing the raw material powder, a wet or dry ball mill, a vibration mill, a beads mill or the like can be used. In order to obtain uniform and fine crystal particles and voids, the most preferable method is a beads mill mixing method since it can pulverize the aggregate efficiently for a short period of time and can realize a favorable dispersed state of additives.

When a ball mill is used for mixing, the mixing time is preferably 15 hours or more, more preferably 19 hours or more. If the mixing time is insufficient, a crystal structure different from a bixbyite structure such as $Al_2O_3$ may be generated in the resulting oxide sintered body.

When a beads mill is used for mixing, the mixing time is varied depending on the size of the apparatus used and the amount of slurry to be treated. However, the mixing time is controlled such that the particle distribution in the slurry becomes uniform (all of the grains have a grain size of 1 μm or less).

At the time of mixing, an arbitral amount of a binder is added, and mixing may be conducted together with the binder.

As the binder, polyvinyl alcohol, vinyl acetate or the like can be used.

A water-based solvent is compounded with the mixed raw material powder to obtain a slurry of the raw material powder.

The slurry of the raw material powder is granulated to obtain granulated powder. The granulated powder is then shaped to produce a shaped body.

For granulation, it is preferable to use quick dry granulation. As the apparatus for quick dry granulation, a spray dryer is widely used. Specific drying conditions are determined according to conditions such as the concentration of slurry to be dried, the temperature of hot air used for drying and the amount of wind. For actually conducting the quick dry granulation, it is required to obtain optimum conditions in advance.

In natural drying, since the speed of sedimentation differs due to the difference in specific gravity of the raw material powder, separation of $In_2O_3$ powder and $Al_2O_3$ powder occurs, and as a result, uniform granulated powder may not be obtained. If a sintered body is made by using this un-uniform granulated powder, $Al_2O_3$ or the like may be generated inside the sintered body, causing abnormal discharge during sputtering.

The granulated powder can be shaped by means of a mold press or a cold isostatic pressing (CIP). The pressure at the time of shaping is 1.2 ton/cm$^2$ or more, for example.

For sintering the shaped body, in addition to the atmospheric sintering pressing, a pressure sintering method such as hot pressing, oxygen pressurization and hot isostatic pressing or the like can be used.

In respect of decrease in production cost, possibility of mass production and easiness in production of a large-sized sintered body, it is preferable to use atmospheric sintering pressing.

In the atmospheric sintering pressing, a shaped body is sintered in the atmosphere or the oxidizing gas atmosphere. Preferably, a shaped body is sintered in the oxidizing gas atmosphere.

The oxidizing gas atmosphere is preferably an oxygen gas atmosphere. It suffices that the oxidizing gas atmosphere be an atmosphere having an oxygen concentration of 10 to 100 vol %, for example. When the oxide sintered body of the invention is fabricated, the density of the oxide sintered body can be further increased by introducing an oxygen gas atmosphere during the heating step.

Firing is conducted at a temperature of 1100 to 1550° C. Further, the firing time is 8 hours or longer.

If the firing temperature is lower than 1100° C. and/or the firing time is shorter than 8 hours, Al is not brought into the solid-solution state in indium oxide crystals, and an $Al_2O_3$ phase or the like may be precipitated inside the target, causing abnormal discharge. On the other hand, if the firing temperature exceeds 1550° C., the average crystal particle size may be increased and large voids may be generated due to significant growth of crystal particles, whereby the strength of the sintered body may be decreased or abnormal discharge may occur.

The firing temperature is preferably 1200 to 1550° C., further preferably 1250 to 1500° C., with 1300 to 1450° C. being particularly preferable.

The firing time is preferably 10 to 50 hours, further preferably 11 to 40 hours, with 12 to 30 hours being particularly preferable.

As for the heating rate at the time of firing, it is preferred that the heating rate be 1 to 15° C./min in the firing temperature range of 500 to 1500° C.

A temperature range of 500 to 1500° C. is a range where sintering proceeds most quickly. If the heating rate in this temperature range is less than 1° C./min, growth of crystal particles becomes significant, whereby an increase in density may not be attained. On the other hand, if the heating rate exceeds 15° C./min, since the uniformity in heat in the sintering furnace is lowered, and the amount of shrinkage during sintering may be varied to cause the sintered body to be broken.

In the method for producing the oxide sintered body of the invention, for the resulting sintered body, a reduction step may further be provided if need arises. A reduction step is a step provided in order to allow the bulk resistance of the sintered body obtained in the above-mentioned firing step to be uniform in the entire target.

As the reduction method which can be used in the reduction step, a reduction treatment by firing in a reductive gas, a reduction treatment by vacuum firing, a reduction treatment by firing in an inert gas or the like can be given.

In the case of a reduction treatment by firing in a reductive gas, hydrogen, methane, carbon monoxide, or a mix gas of these gases with oxygen or the like can be used.

In the case of a reduction treatment by firing in an inert gas, nitrogen, argon, or a mixed gas of these gases with oxygen or the like can be used.

The temperature at the time of the above-mentioned reduction treatment is normally 100 to 800° C., preferably 200 to 800° C. The reduction treatment is conducted normally for 0.01 to 10 hours, preferably 0.05 to 5 hours.

One example of the method for producing the oxide sintered body of the invention is given as follows.

A water-based solvent is compounded with raw material powder containing mixed powder of indium oxide powder and aluminum oxide powder, and the resulting slurry is mixed for 12 hours or longer. Thereafter, the slurry is subjected to solid-liquid separation, dried and granulated. Subsequently, the granulated product is put in a mold and shaped. Then, the resulting shaped product is fired in an oxygen atmosphere for 1100 to 1550° C. for 8 hours or longer, whereby an oxide sintered body can be obtained.

By controlling the conditions in the production process of the sintered body as mentioned above, it is possible to obtain an oxide sintered body having a sintered body density of 6.0 g/cm$^3$ or more, a specific resistance of 0.1 Ωcm or less, and an average crystal particle size of 10 μm or less and formed only substantially of a bixbyite structure of indium oxide in which aluminum atoms are brought into a solid-solution state.

A sputtering target can be obtained by processing the oxide sintered body of the invention. Specifically, the oxide sintered body of the invention is cut into a form which is suited for being mounted in a sputtering apparatus, whereby a sputtering target can be obtained.

The thickness of the target material after cutting is normally 2 to 20 mm, preferably 3 to 12 mm and particularly preferably 4 to 6 mm.

Specifically, in order to allow the oxide sintered body to be a target material, the sintered body is ground by means of a plane grinder to allow the surface roughness Ra to be 5 μm or less. Further, the sputtering surface of the target material may be subjected to mirror finishing, thereby allowing the average surface roughness thereof Ra to be 1000 Å or less. For this mirror finishing (polishing), known polishing techniques such as mechanical polishing, chemical polishing, mechano-chemical polishing (combination of mechanical polishing and chemical polishing) or the like may be used. For example, it can be obtained by polishing by means of a fixed abrasive polisher (polishing liquid: water) to attain a roughness of #2000 or more, or can be obtained by a process in which, after lapping by a free abrasive lap (polisher: SiC paste or the like), lapping is conducted by using diamond paste as a polisher instead of the SiC paste. There are no specific restrictions on these polishing methods.

It is preferable to finish the surface of the target material by means of a #200 to #10,000 diamond wheel, particularly preferably by means of a #400 to #5,000 diamond wheel. If a diamond wheel with a mesh size of smaller than #200 or a diamond wheel with a mesh size of larger than #10,000 is used, the target material may be broken easily.

It is preferred that the surface roughness Ra of the target material be 0.5 μm or less and that the grinding surface have no directivity. If Ra is larger than 0.5 μm or the grinding surface has directivity, abnormal discharge may occur or particles may be generated.

The thus processed target material may be subjected to a cleaning treatment. For cleaning, air blowing, washing with running water or the like can be used. When foreign matters are removed by air blowing, foreign matters can be removed more effectively by air intake by means of a dust collector from the side opposite from the nozzle.

Since the above-mentioned air blow or washing with running water has its limit, ultrasonic cleaning or the like can also be conducted. In ultrasonic cleaning, it is effective to conduct multiplex oscillation within a frequency range of 25 to 300 KHz. For example, it is preferable to perform ultrasonic cleaning by subjecting 12 kinds of frequency composed of every 25 KHz in a frequency range of 25 to 300 KHz to multiplex oscillation.

By bonding the target material obtained in the manner as mentioned above to a backing plate, a sputtering target formed of the oxide sintered body of the invention can be obtained. A plurality of target materials may be provided in a single backing plate to use as a substantially single target.

By forming a film using the target formed of the oxide sintered body of the invention, the oxide semiconductor thin film of the invention can be obtained.

The above-mentioned film formation can be conducted by the deposition method, the sputtering method, the ion plating method, the pulse laser deposition method or the like. An oxide semiconductor thin film which can be formed by the sputtering method or the like by using the target comprising the oxide sintered body of the invention, since aluminum is in the solid-solution state in indium oxide crystals, it is possible to allow the lattice constant to be small. As a result, the 5 s orbits of indiums in the crystal is overlapped to a higher degree, whereby improvement of mobility can be expected. In addition, since Al which is in the solid-solution state in the In site decreases oxygen deficiency, a decrease in carrier density can be expected.

An explanation will be made hereinbelow on the formation of the oxide semiconductor thin film on the substrate by sputtering the target comprising the oxide sintered body of the invention.

Since the oxide sintered body of the invention has a high conductivity, it is possible to apply the DC sputtering method which has a high film-forming speed. Further, the oxide sintered body of the invention can be applied to, in addition to the above-mentioned DC sputtering method, the RF sputtering method, the AC sputtering method and the pulse DC sputtering method, and hence, sputtering free from abnormal discharge is possible.

As the sputtering gas, a mixed gas of argon and an oxidizing gas can be used. Examples of the oxidizing gas include $O_2$, $CO_2$, $O_3$ and $H_2O$.

The oxygen partial pressure at the time of film formation by sputtering is preferably 5% or more and 40% or less. A thin film formed under the conditions in which the oxygen partial pressure is less than 5% has conductivity, and hence, it may be difficult to use as an oxide semiconductor. The oxygen partial pressure is preferably 10% or more and 40% or less.

The substrate temperature at the time of film formation is 500° C. or less, for example, preferably 10° C. or more and 400° C. or less, further preferably 20° C. or more and 350° C. or less, with 80° C. or more and 300° C. or less being particularly preferable.

By introducing water at the time of sputtering, it is possible to prevent fine crystals from being formed in the thin film. If fine crystals are present in the thin film immediately after deposition, secondary crystallization occurs during annealing. As a result, a film has many defects, whereby an increase in carrier density or a lowering in mobility may occur.

The water partial pressure during the film formation by sputtering is preferably $5 \times 10^{-4}$ to $7 \times 10^{-2}$ Pa. If the water partial pressure is less than $5 \times 10^{-4}$ Pa, fine crystals may be generated in the film immediately after deposition of a thin film. On the other hand, if the water partial pressure exceeds $7 \times 10^{-2}$ Pa, the film density may be lowered significantly, and as a result, the degree of overlapping of the In5s orbit may become small, causing a lowering in mobility.

By subjecting the thin film on the substrate which is formed by sputtering to an annealing treatment, the thin film is crystallized and semiconductor properties can be obtained. Further, by subjecting to an annealing treatment, in the oxide semiconductor thin film of the invention, Al is in the solid-solution state in oxide indium crystals, whereby the oxide semiconductor thin film of the invention shows a single phase of bixbyite.

The annealing treatment temperature is 500° C. or less, for example, and preferably 100° C. or more and 500° C. or less, further preferably 150° C. or more and 400° C. or less, with 200° C. or more and 350° C. or less being particularly preferable.

The heating atmosphere of the film formation and the annealing treatment is not particularly restricted. In respect of carrier control properties, the air atmosphere or the oxygen-circulating atmosphere is preferable.

In the annealing treatment, in the presence or absence of oxygen, a lamp annealing apparatus, a laser annealing apparatus, a thermal plasma apparatus, a hot air heating apparatus, a contact heating apparatus or the like can be used.

The oxide semiconductor thin film of the invention thus obtained contains an oxide of indium and an oxide of aluminum, and the atomic ratio Al/(Al+In) in the thin film is 0.01 to 0.08. It is preferred that the oxide semiconductor thin film be substantially composed of indium oxide which has a bixbyite structure, in which aluminum is in the solid-solution state in indium oxide, and the atomic ratio in the thin film Al/(Al+In) be 0.01 to 0.08.

The atomic ratio Al/(Al+In) in the thin film is the same as the atomic ratio Al/(Al+In) of the target (sintered body) used in the formation of the thin film.

The oxide semiconductor thin film of the invention can be used in the thin film transistor, and particularly preferably used in the channel layer of the thin film transistor.

The thin film transistor provided with the oxide semiconductor thin film of the invention as a channel layer (hereinafter often referred to as the thin film transistor of the invention) may be of channel etch type. Since the oxide semiconductor thin film of the invention is a crystalline film which has durability, in the production of the thin film transistor of the invention, it is possible to conduct a photolithographic step in which a thin film of a metal such as Mo is etched to form source/drain electrodes and a channel part.

The thin film transistor of the invention may be of etch stopper type. In the oxide semiconductor thin film of the invention, the etch stopper can protect the channel part formed of the semiconductor layer. In addition, incorporation of a large amount of oxygen in the semiconductor layer at the time of film formation eliminates the need of supply of oxygen from outside through the etch stopper layer. Further, immediately after the film formation, an amorphous film can be formed. As a result, a thin film of a metal such as Mo can be etched to form source/drain electrodes and a channel part, and at the same time, the semiconductor layer can be etched to shorten the photolithographic process.

EXAMPLES

Production of an Oxide Sintered Body and a Target

Examples 1 to 3

Indium oxide powder having an average particle size of 0.98 μm and oxide aluminum powder having an average particle size of 0.97 μm were weighed such that the atomic ratio Al(Al+In) shown in Table 1 was attained. After pulverizing and mixing homogenously, a binder for shaping was added and granulated. Subsequently, this raw material mixed powder was uniformly filled in a mold. Then, the powder was press-molded at a pressure of 140 MPa by means of a cold press machine. The thus obtained shaped body was fired in a sintering furnace at a firing temperature for a firing time shown in Table 1, whereby a sintered body was produced.

The firing atmosphere was the oxygen atmosphere when heating. Firing was conducted in the air (atmosphere) when other treatments than heating were conducted. Firing was conducted at a heating rate of 1° C./min and at a cooling rate of 15° C./min.

The average particle size of the raw material oxide powder was measured by means of a laser diffraction particle size analyzer (SALD-300V, manufactured by Shimadzu Corporation), and as the average particle size, the median diameter D50 was used.

For the resulting sintered body, the crystal structure was examined by means of an X-ray diffraction measurement apparatus (Ultima-III, manufactured by Rigaku Corporation). X-ray charts of the sintered bodies obtained in Examples 1 to 3 are respectively shown in FIGS. 1 to 3.

Figure 1:
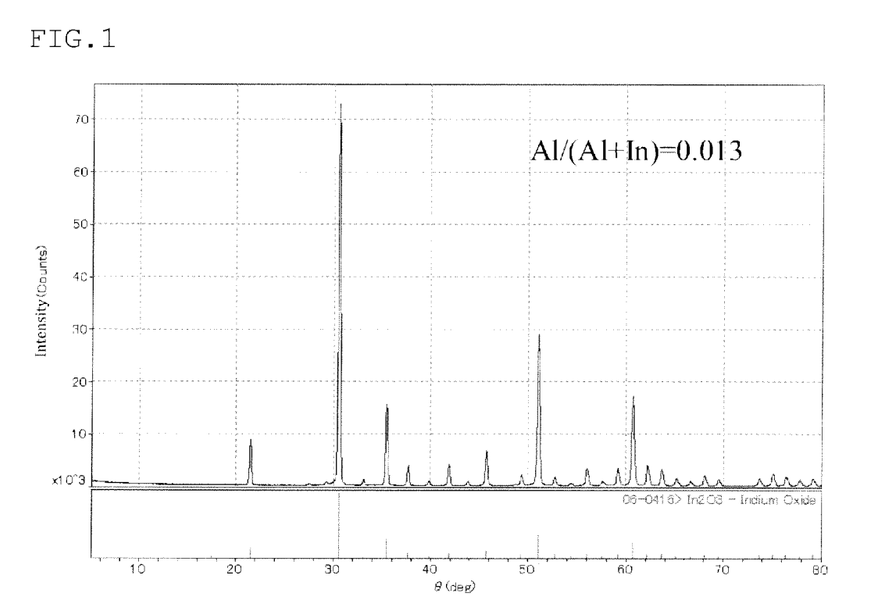
FIG. 1 is a view showing the results of X-ray diffraction measurement of a sintered body produced in Example 1.
Figure 2:
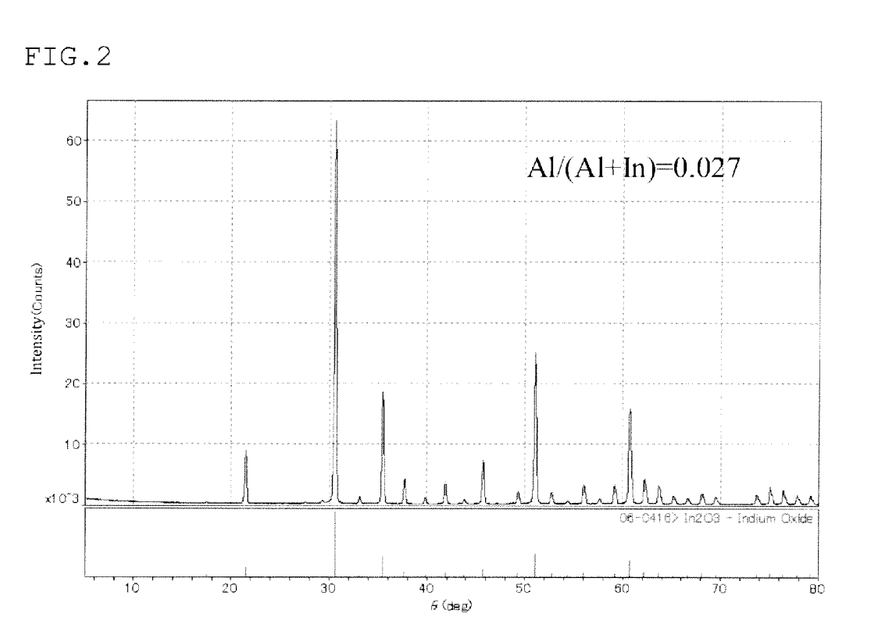
FIG. 2 is a view showing the results of X-ray diffraction measurement of a sintered body produced in Example 2.
Figure 3:
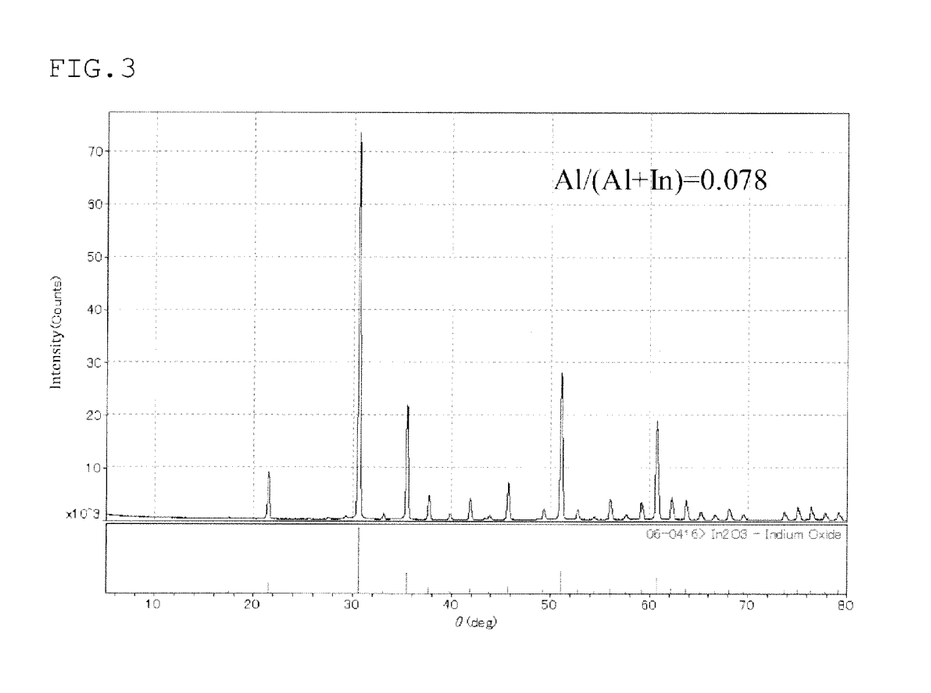
FIG. 3 is a view showing the results of X-ray diffraction measurement of a sintered body produced in Example 3.

As a result of analysis of the charts, in the sintered bodies in Examples 1 to 3, only the bixbyite structure of indium oxide was observed. This crystal structure could be confirmed by the JCPDS (Joint Committee of Powder Diffraction Standards) cards. The bixbyite structure of indium oxide was No. 06-0416 of the JCPDS card.

The measuring conditions of the X-ray diffraction measurement (XRD) are as follows.
Apparatus: Ultima-III, manufactured by Rigaku Corporation
X rays: Cu—Kα rays (wavelength: 1.5406 Å, monochromatized by means of a graphite monochrometer)
2θ-θ reflection method, continuous scanning (1.0°/min)
Sampling interval: 0.02°
Slit DS, SS: 2/3°, RS: 0.6 mm The density of the resulting sintered body was calculated from the weight and the external dimension of the sintered body which had been cut into a specific size. The bulk resistance (conductivity) of the resulting sintered body was measured by the four probe method (JIS R1637) using a resistivity meter (Loresta, manufactured by Mitsubishi Chemical Corporation). The results are shown in Table 1.

For the resulting sintered body, dispersion of Al was examined by the measurement of EPMA. As a result, an aggregate of aluminum atoms each having a size of 1 μm or more was not observed, and it was understood that the sintered bodies in Examples 1 to 3 were significantly excellent in dispersibility and uniformity.

The measuring conditions of EPMA are as follows.
Name of apparatus: JXA-8200 (manufactured by JEOL Ltd.)
Acceleration voltage: 15 kV
Irradiation current: 50 nA
Irradiation time (per point): 50 mS The surfaces of the oxide sintered bodies obtained in Examples 1 to 3 were ground by means of a plane grinder. The corners were cut by means of a diamond cutter and the oxide sintered bodies were laminated to a backing plate, whereby sputtering targets each having a diameter of 4 inches were obtained.

The resulting sputtering targets were mounted in a DC sputtering apparatus. Argon was used as the sputtering gas, and 10 kWh continuous sputtering was conducted under the following conditions:
Sputtering pressure: 0.4 Pa
Substrate temperature: room temperature
DC output: 400 W Variations in voltage during sputtering were stored in a data logger to confirm occurrence of abnormal discharge. The results are shown in Table 1.

Occurrence of the above-mentioned abnormal discharge was confirmed by detecting abnormal discharge by monitoring variations in voltage. Specifically, a case where variations in voltage which occur during a 5-minute measurement accounted for 10% or more of the working voltage during the sputtering operation was evaluated as abnormal discharge. In particular, when the working voltage varies ±10% in 0.1 sec during the sputtering operation, a micro-arc which is abnormal discharge of sputtering discharge may have occurred. In such a case, the yield of a device may be lowered, leading to difficulty in mass production of a device.

Further, by using the sputtering targets in Examples 1 to 3, and by using as the atmosphere a mixed gas in which 3% hydrogen gas was added to an argon gas, sputtering was conducted continuously for 30 hours. Occurrence of nodules was confirmed. As a result, on the surface of the sputtering targets in Examples 1 to 3, no nodules were observed.

The sputtering conditions were as follows.
Sputtering pressure: 0.4 Pa, DC output: 100 W, Substrate temperature: room temperature Hydrogen gas was added to the atmosphere gas in order to promote generation of nodules.

As for observation of the nodules, a change in the target surface was observed by means of a stereoscopic microscope (magnification: ×50), and the average number of nodules with a size of 20 μm or more which were generated in a viewing field of 3 mm² was calculated. The number of generated nodules was shown in Table 1.

TABLE 1

|  | Al/(Al + In) | Firing temperature [° C.] | Firing time [hr] | Crystal structure | Sintered body density [g/cm³] | Bulk resistance [mΩcm] | Abnormal discharge during sputtering | Number of generated nodules [per 3 mm²] |
|---|---|---|---|---|---|---|---|---|
| Example 1 | 0.013 | 1400 | 12 | Bixbyite | 7.03 | 4.21 | None | 0 |
| Example 2 | 0.027 | 1400 | 12 | Bixbyite | 7.02 | 3.05 | None | 0 |
| Example 3 | 0.078 | 1400 | 12 | Bixbyite | 6.88 | 1.91 | None | 0 |

Comparative Examples 1 to 3

Sintered bodies and targets were produced and evaluated in the same manner as in Examples 1 to 3, except that indium oxide powder having an average particle size of 0.98 μm and aluminum oxide powder having an average particle size of 0.97 μm were weighed such that the atomic ratio Al/(Al+In) shown in Table 2 was attained. The results are shown in Table 2.

In Comparative Example 1, a sintered body and a target were produced by using indium oxide powder alone.

Comparative Examples 4 and 5

Sintered bodies and targets were produced and evaluated in the same manner as in Examples 1 to 3, except that, instead of aluminum oxide, oxide yttrium powder ($Y_2O_3$ powder) having an average particle size of 1.06 μm was weighed in Comparative Example 4 and boron oxide powder ($B_2O_3$ powder) having an average particle size of 1.02 μm was weighed in Comparative Example 5 such that the atomic ratio M/(M+In) shown in Table 2 was attained. The results are shown in Table 2.

TABLE 2

| | Atomic ratio M/(M + In) | M | Firing temperature [° C.] | Firing time [hr] | Crystal structure | Sintered body density [g/cm³] | Bulk resistance [mΩcm] | Occurrence of abnormal discharge during sputtering | Number of generated nodules [per 3 mm²] |
|---|---|---|---|---|---|---|---|---|---|
| Com. Ex. 1 | 0 | Al | 1400 | 12 | Bixbyite | 6.98 | 111 | Micro arc generated | 21 |
| Com. Ex. 2 | 0.005 | Al | 1400 | 12 | Bixbyite | 6.87 | 12.1 | Micro arc generated | 4 |
| Com. Ex. 3 | 0.23 | Al | 1400 | 12 | Bixbyite Corundum | 6.54 | 15.2 | Micro arc generated | 38 |
| Com. Ex. 4 | 0.03 | Y | 1400 | 12 | Bixbyite | 4.81 | 102 | Micro arc generated | 16 |
| Com. Ex. 5 | 0.03 | B | 1400 | 12 | Bixbyite | 4.21 | 147 | Micro arc generated | 47 |

As is understood from Table 2, when sputtering targets of Comparative Examples 1 to 5 were used, abnormal discharge occurred during sputtering and nodules were observed on the target surface. Further, it can be understood that, as for the sintered bodies of Comparative Examples 4 and 5 in which yttrium oxide and boron oxide were used, the sintered body density was significantly lower as compared with the targets of Examples 1 to 3.

As for the sintered bodies of Comparative Examples 1 to 5, the crystal structure was examined by means of an X-ray diffraction apparatus in the same manner as in Examples 1 to 3. As a result, in the sintered body of Comparative Example 3, in the X-ray diffraction chart, not only the bixbyite structure, but also the $Al_2O_3$ phase having a corundum structure could be observed. This crystal structure can be confirmed by the JCPDS card. The corundum structure of $Al_2O_3$ can be confirmed by the JCPDS No. 10-173.

Formation of an Oxide Semiconductor Thin Film and Production of a Thin Film Transistor

Example 4

On a glass substrate and a silicon substrate provided with a 100 nm-thick thermally oxidized film ($SiO_2$), a 50 nm-thick thin film was respectively formed by the DC magnetron sputtering method by using the target (Al/(In+Al)=0.013) obtained in Example 1.

Sputtering was conducted as follows. After conducting vacuum evacuation until the back pressure became $1\times10^{-4}$ Pa, the pressure was adjusted to 0.4 Pa by flowing argon at 9.9 sccm and water at 0.1 sccm (water partial pressure: $4.0\times10^{-3}$ Pa). Sputtering was conducted at a sputtering power of 100 W at room temperature.

The crystal structure, immediately after the film formation, of the thin film formed on the glass substrate was confirmed by XRD. As a result, no clear diffraction peaks were observed, demonstrating that the film was amorphous. The glass substrate on which this thin film was formed was put in a heating furnace heated to 300° C. in the air, and a treatment was conducted for 1 hour.

XRD measurement was conducted for the thin film after the annealing treatment, and only a peak derived from the bixbyite structure of indium oxide was observed. This crystal structure can be confirmed by the JCPDS card No. 06-0416.

The carrier concentration and the mobility of the thin film after the annealing treatment were evaluated by the Hall effect measurement. As a result, it was found that the carrier concentration was $6.98\times10^{17}$ cm$^{-3}$ and a Hall mobility was 24.5 cm²/Vs. It was confirmed that the atomic ratio of the thin film after the anneal treatment was the same as that of the target used.

A metal mask was provided on the silicon substrate on which the film was formed (conductive silicon substrate), and a channel part with a length (L) of 200 μm and a width (W) of 1,000 μm was formed. Then, gold was deposited to form source/drain electrodes. The device was put in a heating furnace which was heated to 300° C., and a treatment was conducted for 1 hour, whereby a thin film transistor was produced.

For the thus produced thin film transistor, evaluation was made on the field effect mobility, the on-off ratio and the S-value. As a result, it was confirmed that the field effect mobility was 38.8 cm²/Vs, the on-off ratio was $8.18\times10^8$, i.e. normally-off properties, and the S-value was 0.66.

Example 5

On a glass substrate and a silicon substrate provided with a 100 nm-thick thermally oxidized film ($SiO_2$), a 50 nm-thick thin film was respectively formed by the DC magnetron sputtering method by using the target (Al/(In+Al)=0.027) obtained in Example 2.

Sputtering was conducted as follows. After conducting vacuum evacuation until the back pressure became $1\times10^{-4}$ Pa, the pressure was adjusted to 0.4 Pa by flowing argon at 9.9 sccm and water at 0.1 sccm (water partial pressure of $4.0\times10^{-3}$ Pa). Sputtering was conducted at a sputtering power of 100 W at room temperature.

The crystal structure, immediately after the film formation, of the thin film formed on the glass substrate was confirmed by XRD. As a result, no clear diffraction peaks were observed, demonstrating that the film was amorphous. The glass substrate on which this thin film was formed was put in a heating furnace heated to 300° C. in the air, and a treatment was conducted for 1 hour.

XRD measurement was conducted for the thin film after the annealing treatment, and as a result, only a peak derived from the bixbyite structure of indium oxide was observed. This crystal structure can be confirmed by the JCPDS card No. 06-0416.

The carrier concentration and the mobility of the thin film after the annealing treatment were evaluated by the Hall effect measurement. As a result, it was found that the carrier concentration was $2.37 \times 10^{17}$ cm$^{-3}$ and a Hall mobility was 22.1 cm$^2$/Vs.

A metal mask was provided on the silicon substrate on which the film was formed (conductive silicon substrate), and a channel part with a length (L) of 200 μm and a width (W) of 1,000 μm was formed. Then, gold was deposited to form source/drain electrodes. The device was put in a heating furnace which was heated to 300° C., and a treatment was conducted for 1 hour, whereby a thin film transistor was produced.

For the thus produced thin film transistor, evaluation was made on the field effect mobility, the on-off ratio and the S-value. As a result, it was confirmed that the field effect mobility was 31.1 cm$^2$/Vs, the on-off ratio was $3.11 \times 10^8$, i.e. normally-off properties, and the S-value was 0.52.

Example 6

On a glass substrate and a silicon substrate provided with a 100 nm-thick thermally oxidized film (SiO$_2$), a 50 nm-thick thin film was respectively formed by the DC magnetron sputtering method by using the target (Al/(In+Al)=0.078) obtained in Example 3.

Sputtering was conducted as follows. After conducting vacuum evacuation until the back pressure became $1 \times 10^{-4}$ Pa, the pressure was adjusted to 0.4 Pa by flowing argon at 9.9 sccm and oxygen at 0.1 sccm (water partial pressure of $4.0 \times 10^{-3}$ Pa) Sputtering was conducted at a sputtering power of 100 W at room temperature.

The crystal structure, immediately after the film formation, of the thin film formed on the glass substrate was confirmed by XRD. As a result, no clear diffraction peaks were observed, demonstrating that the film was amorphous. The glass substrate on which this thin film was formed was put in a heating furnace heated to 300° C. in the air, and a treatment was conducted for 1 hour. XRD measurement was conducted for the thin film after the annealing treatment, and as a result, only a peak derived from the bixbyite structure of indium oxide was observed. This crystal structure can be confirmed by the JCPDS card No. 06-0416.

The carrier concentration and the mobility after the annealing treatment were evaluated by the Hall effect measurement. As a result, it was found that the carrier concentration was $5.88 \times 10^{16}$ cm$^{-3}$ and a Hall mobility was 18.8 cm$^2$/Vs.

A metal mask was provided on the silicon substrate on which the film was formed (conductive silicon substrate) and a channel part with a length (L) of 200 μm and a width (W) of 1,000 μm was formed. Then, gold was deposited to form source/drain electrodes. The device was put in a heating furnace which was heated to 300° C., and a treatment was conducted for 1 hour, whereby a thin film transistor was produced.

For the thus produced thin film transistor, evaluation was made on the field effect mobility, the on-off ratio and the S-value. As a result, it was confirmed that the field effect mobility was 24.3 cm$^2$/Vs, the on-off ratio was $2.56 \times 10^8$, i.e. normally-off properties, and the S-value was 0.77.

Comparative Example 6

On a glass substrate and a silicon substrate provided with a 100 nm-thick thermally oxidized film (SiO$_2$), a 50 nm-thick thin film was respectively formed by the DC magnetron sputtering method by using the target (Al/(In+Al)=0.23) obtained in Comparative Example 3.

Sputtering was conducted as follows. After conducting vacuum evacuation until the back pressure became $1 \times 10^{-4}$ Pa, the pressure was adjusted to 0.4 Pa by flowing an argon gas at 9.9 sccm and water at 0.1 sccm (water partial pressure of $4.0 \times 10^{-3}$ Pa). Sputtering was conducted at a sputtering power of 100 W at room temperature.

The crystal structure, immediately after the film formation, of the thin film formed on the glass substrate was confirmed by XRD. As a result, no clear diffraction peaks were observed, demonstrating that the film was amorphous. The glass substrate on which this thin film was formed was put in a heating furnace heated to 300° C. in the air, and a treatment was conducted for 1 hour. The thin film after the annealing treatment was subjected to XRD treatment. As a result, no clear diffraction peaks were observed, demonstrating that the film was amorphous.

The carrier concentration and the mobility after the annealing treatment were evaluated by the Hall effect measurement. As a result, it was found that the carrier concentration was $7.28 \times 10^{16}$ cm$^{-3}$ and a Hall mobility was 9.7 cm$^2$/Vs, and that the Hall mobility was significantly inferior to the thin films in Examples 4 to 6.

A metal mask was provided on the silicon substrate on which the film was formed (conductive silicon substrate) and a channel part with a length (L) of 200 μm and a width (W) of 1,000 μm was formed. Then, gold was deposited to form source/drain electrodes. The device was put in a heating furnace which was heated to 300° C., and a treatment was conducted for 1 hour, whereby a thin film transistor was produced.

For the thus produced thin film transistor, evaluation was made on the field effect mobility, the on-off ratio and the S-value. As a result, it was confirmed that the field effect mobility was 7.8 cm$^2$/Vs, the on-off ratio was $2.43 \times 10^6$, i.e. normally-off properties, and the S-value was 1.87. It is apparent that this thin film transistor had a field effect mobility which was significantly interior to those of the transistors in Examples 4 to 6.

INDUSTRIAL APPLICABILITY

The sputtering target comprising the oxide sintered body of the invention can be used for the production of a thin film transistor or the like. Further, the thin film transistor of the invention can be used in an integrated circuit or the like.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. An oxide sintered body having an atomic ratio Al/(Al+In) of 0.01 to 0.08 wherein the oxide sintered body is formed of indium oxide having a bixbyite structure in which aluminum atoms are in the solid-solution state in the indium oxide, and 98 vol % or more of the crystal structure of the oxide sintered body is an indium oxide crystal having the bixbyite structure.

2. A method for producing the oxide sintered body according to claim 1, comprising the steps of:
   mixing indium oxide powder having an average particle size of less than 1.2 µm and aluminum oxide powder having an average particle size of less than 1.2 µm such that the atomic ratio Al/(Al+In) becomes 0.01 to 0.08 to prepare mixture powder;
   shaping the mixture powder to produce a shaped body; and
   firing the shaped body at 1100° C. to 1550° C. for 8 hours or more.

3. The method for producing the oxide sintered body according to claim 2, wherein the firing is conducted in the atmosphere of an oxidizing gas.

4. A target obtained by processing the oxide sintered body according to claim 1.

5. An oxide semiconductor thin film which is obtained by sputtering the target according to claim 4 to form a thin film, followed by annealing the thin film,
   wherein the thin film has an atomic ratio Al/(Al+In) of 0.01 to 0.08 and has a bixbyite structure of indium oxide.

6. The oxide semiconductor thin film according to claim 5, wherein the sputtering is conducted at a water partial pressure of $5 \times 10^{-4}$ to $7 \times 10^{-2}$ Pa.

7. A thin film transistor having the oxide semiconductor thin film according to claim 5 as the channel layer.

8. A display comprising the thin film transistor according to claim 7.

9. The oxide sintered body according to claim 1, which has a density of 6.88 g/cm$^3$ or more.

10. The oxide sintered body according to claim 1, which has a specific resistance of 4.21 mΩcm or less.

* * * * *